United States Patent
Fachmann et al.

(10) Patent No.: US 12,368,052 B2
(45) Date of Patent: Jul. 22, 2025

(54) CHIP-SUBSTRATE COMPOSITE SEMICONDUCTOR DEVICE

(71) Applicant: Infineon Technologies Austria AG, Villach (AT)

(72) Inventors: Christian Fachmann, Fürnitz (AT); Barbara Angela Glanzer, Klagenfurt (AT); Andreas Riegler, Lichtpold (AT)

(73) Assignee: Infineon Technologies Austria AG, Villach (AT)

( * ) Notice: Subject to any disclaimer, the term of this patent is extended or adjusted under 35 U.S.C. 154(b) by 505 days.

(21) Appl. No.: 17/380,067

(22) Filed: Jul. 20, 2021

(65) Prior Publication Data

US 2022/0028699 A1    Jan. 27, 2022

(30) Foreign Application Priority Data

Jul. 21, 2020 (EP) .................................... 20186986

(51) Int. Cl.
*H01L 21/463* (2006.01)
*H01L 21/768* (2006.01)
(Continued)

(52) U.S. Cl.
CPC ...... *H01L 21/463* (2013.01); *H01L 21/76802* (2013.01); *H01L 21/76877* (2013.01); *H01L 23/5226* (2013.01); *H01L 23/528* (2013.01)

(58) Field of Classification Search
CPC ............... H01L 21/463; H01L 23/5226; H01L 23/49827; H01L 21/486; H01L 24/97;
(Continued)

(56) References Cited

U.S. PATENT DOCUMENTS 5,450,290 A * 9/1995 Boyko ................. H05K 3/4053
257/E23.079
5,904,499 A    5/1999 Pace
(Continued)

FOREIGN PATENT DOCUMENTS

WO    0141207 A1    6/2001

OTHER PUBLICATIONS

"Selecting The Right Substrate Materials for High Power Electronics", https://www.accumet.com/resources/3387-tb-selecting-substrate-materials.pdf, pp. 1-10.

*Primary Examiner* — Bac H Au
(74) *Attorney, Agent, or Firm* — Murphy, Bilak & Homiller, PLLC

(57) ABSTRACT

A method of manufacturing a semiconductor device includes forming a plurality of patterns of metal structures in a dielectric inorganic substrate wafer. The metal structures are accommodated in recesses of the dielectric inorganic substrate wafer and at least partly connect through the dielectric inorganic substrate. The method further includes providing a semiconductor wafer comprising a front side and a backside, wherein a plurality of electrodes is disposed on the front side of the semiconductor wafer. The front side of the semiconductor wafer is bonded to the dielectric inorganic substrate wafer to form a composite wafer, wherein the plurality of patterns of metal structures is connected to the plurality of electrodes. The composite wafer is separated into composite chips.

17 Claims, 5 Drawing Sheets

(51) Int. Cl.
*H01L 23/522* (2006.01)
*H01L 23/528* (2006.01)

(58) Field of Classification Search
CPC .............. H01L 21/78; H01L 21/76802; H01L 21/76877
See application file for complete search history.

(56) References Cited

U.S. PATENT DOCUMENTS

| | | | | |
|---|---|---|---|---|
| 5,998,292 | A * | 12/1999 | Black | H01L 25/0657 438/618 |
| 6,229,209 | B1 * | 5/2001 | Nakamura | H01L 23/49827 257/E21.511 |
| 6,521,530 | B2 * | 2/2003 | Peters | H01L 23/49822 257/E23.079 |
| 6,693,361 | B1 * | 2/2004 | Siniaguine | H01L 24/11 257/E21.597 |
| 7,049,693 | B2 * | 5/2006 | Canella | G01R 1/0466 257/E23.068 |
| 7,060,601 | B2 * | 6/2006 | Savastiouk | H01L 23/5384 257/E23.172 |
| 7,804,985 | B2 * | 9/2010 | Szewerenko | H01L 23/3135 257/E23.177 |
| 8,168,474 | B1 * | 5/2012 | Adkisson | H01L 21/76898 438/106 |
| 8,390,009 | B2 * | 3/2013 | Wang | H01L 24/17 438/22 |
| 8,411,459 | B2 * | 4/2013 | Yu | H01L 23/49827 361/783 |
| 8,455,995 | B2 * | 6/2013 | Tsai | H01L 21/76898 257/777 |
| 8,513,119 | B2 * | 8/2013 | Chang | H01L 25/50 257/E21.585 |
| 8,519,538 | B2 * | 8/2013 | Hsia | H01L 21/76898 438/668 |
| 8,624,360 | B2 * | 1/2014 | Ching | H01L 25/0657 257/621 |
| 8,689,437 | B2 * | 4/2014 | Dang | H01L 25/0657 29/829 |
| 8,691,664 | B2 * | 4/2014 | Yang | H01L 21/76898 438/459 |
| 8,716,131 | B2 * | 5/2014 | Chen | H01L 24/05 438/667 |
| 8,928,159 | B2 * | 1/2015 | Chang | H01L 23/481 257/737 |
| 9,048,233 | B2 * | 6/2015 | Wu | H01L 21/486 |
| 9,105,628 | B1 * | 8/2015 | Dubin | H01L 21/76879 |
| 9,209,157 | B2 * | 12/2015 | Chiou | H01L 21/76898 |
| 9,548,273 | B2 * | 1/2017 | Gao | H01L 21/6835 |
| 9,748,106 | B2 * | 8/2017 | Lo | H01L 21/304 |
| 9,818,729 | B1 * | 11/2017 | Chiu | H01L 24/96 |
| 2005/0059217 | A1 | 3/2005 | Morrow et al. | |
| 2006/0145356 | A1 | 7/2006 | Liu et al. | |
| 2009/0224405 | A1 | 9/2009 | Chiou et al. | |
| 2011/0193221 | A1 * | 8/2011 | Hu | H01L 23/3121 257/737 |
| 2011/0204753 | A1 | 8/2011 | Kikuchi et al. | |
| 2011/0227226 | A1 * | 9/2011 | Chiang | H01L 24/97 257/751 |
| 2011/0241214 | A1 | 10/2011 | Feng et al. | |
| 2012/0292757 | A1 * | 11/2012 | Mauder | H01L 29/78 257/774 |
| 2012/0313247 | A1 * | 12/2012 | Yu | H01L 21/76831 257/E21.597 |
| 2013/0020589 | A1 * | 1/2013 | Yu | H01L 33/0093 257/E33.057 |
| 2015/0171024 | A1 * | 6/2015 | Choi | H01L 21/561 257/774 |
| 2015/0294953 | A1 * | 10/2015 | Chen | H01L 21/566 438/107 |
| 2016/0079138 | A1 | 3/2016 | Uzoh et al. | |
| 2016/0172288 | A1 * | 6/2016 | Audet | H01L 21/0274 361/783 |
| 2016/0307872 | A1 * | 10/2016 | Chen | H01L 21/4857 |
| 2022/0028699 | A1 * | 1/2022 | Fachmann | H01L 21/76802 |
| 2023/0238294 | A1 * | 7/2023 | Fachmann | H01L 23/49562 257/734 |

* cited by examiner

CHIP-SUBSTRATE COMPOSITE SEMICONDUCTOR DEVICE

TECHNICAL FIELD

This disclosure relates generally to the field of semiconductor devices, and in particular to the field of packaging semiconductor chips.

BACKGROUND

Semiconductor device manufacturers are constantly striving to increase the performance of their products, while decreasing their cost of manufacture. A cost and device performance sensitive area in the manufacture of a semiconductor device is packaging the semiconductor chip. Packaging involves, inter alia, forming an electrical interconnect from chip electrodes (die pads) to package terminals. The interconnect technology should provide for high electrical and thermal performance and reliability of the semiconductor device. Further aspects aim at cost efficient manufacturing processes and customer benefits in view of product versatileness and package mount ability.

SUMMARY

According to an aspect of the disclosure a method of manufacturing a semiconductor device comprises forming a plurality of patterns of metal structures in a dielectric inorganic substrate wafer. The metal structures are accommodated in recesses of the dielectric inorganic substrate wafer and at least partly connect through the dielectric inorganic substrate wafer. The method further comprises providing a semiconductor wafer comprising a front side and a backside, wherein a plurality of electrodes is disposed on the front side of the semiconductor wafer. The front side of the semiconductor wafer is bonded to the dielectric inorganic substrate wafer to form a composite wafer, wherein the plurality of patterns of metal structures is connected to the plurality of electrodes. The composite wafer is separated into composite chips.

According to another aspect of the disclosure a semiconductor device comprises a semiconductor chip comprising a front side and a backside, wherein an electrode is disposed on the front side of the semiconductor chip. The semiconductor device further comprises a dielectric inorganic substrate comprising a pattern of metal structures which are accommodated in recesses of the dielectric inorganic substrate and at least partly connect through the dielectric inorganic substrate. The front side of the semiconductor chip is attached to the dielectric inorganic substrate and the electrode is connected to the pattern of metal structures.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

DETAILED DESCRIPTION

As used in this specification, the terms "electrically connected" or "connected" or similar terms are not meant to mean that the elements are directly contacted together; intervening elements may be provided between the "electrically connected" or "connected" elements, respectively. However, in accordance with the disclosure, the above-mentioned and similar terms may, optionally, also have the specific meaning that the elements are directly contacted together, i.e. that no intervening elements are provided between the "electrically connected" or "connected" elements, respectively.

Further, the words "over" or "beneath" with regard to a part, element or material layer formed or located "over" or "beneath" a surface may be used herein to mean that the part, element or material layer be located (e.g. placed, formed, arranged, deposited, etc.) "directly on" or "directly under", e.g. in direct contact with, the implied surface. The word "over" or "beneath" used with regard to a part, element or material layer formed or located "over" or "beneath" a surface may, however, either be used herein to mean that the part, element or material layer be located (e.g. placed, formed, arranged, deposited, etc.) "indirectly on" or "indirectly under" the implied surface, with one or more additional parts, elements or layers being arranged between the implied surface and the part, element or material layer.

Figure 1:
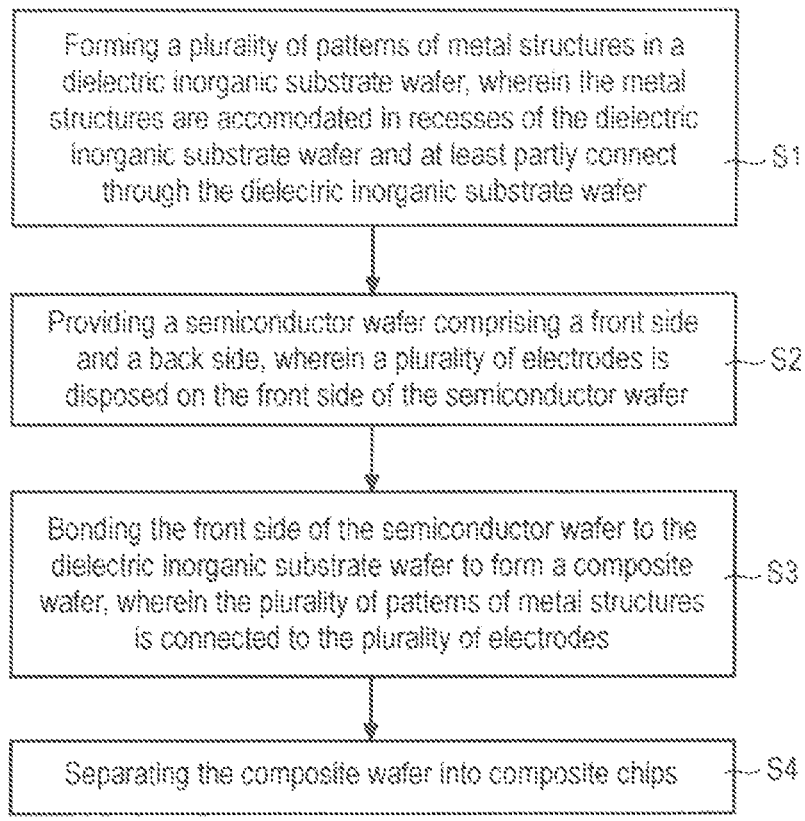
FIG. 1 is a flowchart of an exemplary method of manufacturing a semiconductor device in accordance with the disclosure.

Referring to FIG. 1, at S1 a plurality of patterns of metal structures is formed in a dielectric inorganic substrate wafer. The metal structures are accommodated in recesses of the dielectric inorganic substrate wafer and at least partly connect through the dielectric inorganic substrate wafer.

At S2 a semiconductor wafer comprising a front side and a backside is provided. The semiconductor wafer may, e.g., be a processed wafer in which integrated devices have already been formed. The semiconductor wafer may, e.g., be a fully front-end-of-line (FOEL) processed semiconductor wafer. A plurality of electrodes (die pads) is disposed on the front side of the semiconductor wafer.

The semiconductor wafer may, e.g., be made of any semiconductor material, e.g. Si, SiC, SiGe, GaAs, GaN, AlGaN, InGaAs, InAlAs, etc.

At S3 the front side of the semiconductor wafer is bonded to the dielectric inorganic substrate wafer to form a composite wafer. The plurality of patterns of metal structures is connected to the plurality of electrodes.

At S4 the composite wafer is then separated into composite chips. As will be described further below in more detail, the composite chips may optionally be embedded in an encapsulant.

Figure 2A:
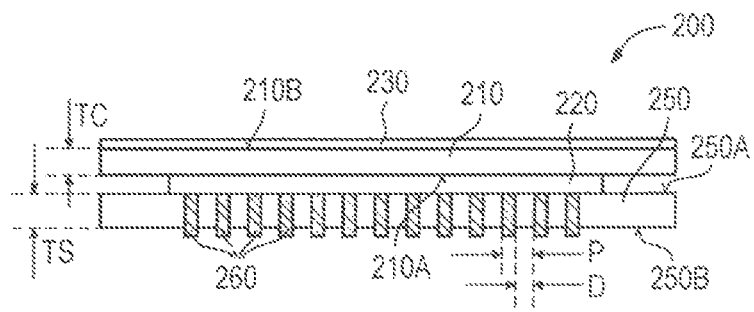
FIG. 2A is a schematic cross-sectional view of an exemplary semiconductor device comprising a semiconductor chip and a dielectric inorganic substrate in accordance with the disclosure.

FIG. 2A illustrates a schematic cross-sectional view of an exemplary semiconductor device 200. The semiconductor device 200 may, e.g., correspond to a composite chip as produced at S4 in FIG. 1 by separating the composite wafer into composite chips.

The semiconductor device 200 includes a semiconductor chip 210. The semiconductor chip 210 has a front side 210A and a backside 210B. At least one electrode (die pad) 220 is disposed on the front side 210A of the semiconductor chip 210.

A dielectric inorganic substrate 250 is attached to the front side 210A of the semiconductor chip 210. The dielectric inorganic substrate 250 comprises a pattern of metal structures 260. The metal structures 260 are accommodated in recesses of the dielectric inorganic substrate 250. At least a part of the metal structures 260 (e.g. all of them as shown in exemplary FIG. 2A) connect through the dielectric inorganic substrate 250. That is, in this case the recesses in the dielectric inorganic substrate 250 may form through-holes passing through the dielectric inorganic substrate 250. The electrode 220 is connected to the pattern of metal structures 260.

The dielectric inorganic substrate 250 may be a glass substrate or a semiconductor substrate. If the metal structures 260 are required to be electrically insulated from each other, glass or an intrinsic semiconductor substrate material or a semiconductor substrate having recesses with insulated side walls could be used. Recesses with insulated side walls may, e.g., be formed by applying an insulating layer (e.g. a silicon oxide layer or a silicon nitride layer) to the side walls of the recesses.

The dielectric inorganic substrate 250 may have a thickness TS which may be equal to or greater than or less than 25 μm or 50 μm or 100 μm or 200 μm. Depending on the thickness TS of the dielectric inorganic substrate 250, the length of the metal structures 260 may, e.g., be a few μm greater than TS. That is, the metal structures 260 may protrude a small distance (e.g. a few μm) over a top surface 250A and/or over a bottom surface 250B of the dielectric inorganic substrate 250.

The pattern of metal structures 260 may, e.g., be a regular array. A pitch P of the pattern of metal structures 260 may, e.g., be equal to or greater than or less than 15 μm or 17.5 μm or 20 μm or 22.5 μm or 25 μm or 27.5 μm or 30 μm. The distance D between adjacent metal structures 260 may, e.g., be equal to or greater than or less than 10 μm or 5 μm or 4 μm or 3 μm or 2 μm. The lateral dimension(s) of each metal structure 260 may, e.g., be equal to or greater than or less than 12.5 μm or 15 μm or 17.5 μm or 20 μm or 22.5 μm or 25 μm or 27.5 μm.

In one specific example the lateral dimension(s) of each metal structure 260 may be about 20 μm and the pitch P may be between 22 μm and 25 μm.

The pattern of the metal structures 260 may cover the complete area of the electrode 220 or at least a substantial portion (e.g. equal to or more than 70% or 80% or 90% or 95%) thereof. For instance, the electrode 220 may be a load electrode (e.g. source electrode or a drain electrode) of a power transistor and the complete load electrode area or a substantial portion thereof may be covered by the pattern of the metal structures 260.

The semiconductor chip 210 may include integrated circuitry such as, e.g., transistor(s), in particular power transistor(s). For instance, the electrode 220 may form a (front side) load electrode of a power integrated circuitry. The semiconductor chip 210 may further be equipped with a backside electrode 230. The backside electrode 230 may also form a load electrode of the power integrated circuitry implemented in the semiconductor chip 210.

The (front side) electrode 220 may cover a substantial portion of the area of the semiconductor chip 210, e.g. equal to or more than 50% or 60% or 70% or 80% or 90% of the area of the front side 210A of the semiconductor chip 210. Similarly, the backside electrode 230 may cover a substantial portion of the area of the semiconductor chip 210, e.g. equal to or more than 50% or 60% or 70% or 80% or 90% of the area of the backside 210B of the semiconductor chip 210. For instance, as exemplified in FIG. 2A, the backside electrode 230 may cover the full area of the backside 210B of the semiconductor chip 210.

The semiconductor chip 210 may have a thickness TC equal to or less than 100 μm or 50 μm or 30 μm. As known in the art, for same integrated device such as, e.g., power devices, the smaller the thickness TC of the semiconductor chip 210, the higher is the device performance which can be obtained. Therefore, in particular small values of TC (i.e. thin semiconductor chips 210) may be desired to be used in the semiconductor device 200.

In some embodiments, TC is equal to or smaller than TS. That is, the electrical interconnect formed by the dielectric inorganic substrate 250 may, e.g., be as thick as or thicker than the semiconductor chip 210.

Figure 2B:
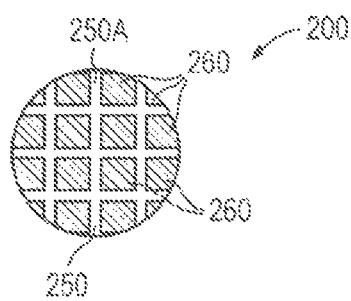
FIG. 2B is a schematic partial top view on a dielectric inorganic substrate as seen from the viewing direction of the semiconductor chip.

FIG. 2B illustrates a partial top view on the dielectric inorganic substrate 250 as seen from the viewing direction of the semiconductor chip 210. As apparent from FIG. 2B the metal structures 260 may be arranged in a densely packed array in the dielectric inorganic substrate 250. Differently put, the dielectric inorganic substrate 250 may form a matrix for the pattern or array of metal structures 260. The percentage in volume of the metal of the metal structures 260 in the dielectric inorganic substrate 250 may be high, e.g. equal to or greater than, e.g., 60% or 70% or 80%.

By virtue of the dielectric inorganic substrate 250, the semiconductor device 200 may have advanced heat dissipation properties. Heat dissipation in semiconductor devices 200 relies, inter alia, on the electrical interconnect between the semiconductor chip 210 and an application board to which the semiconductor chip 210 (or a package including the semiconductor chip 210) is mounted. The electrical interconnect provides a thermal conductivity to remove heat from the package and provides a heat capacity to absorb heat so as to protect the semiconductor chip 210 from temporary overheating.

The pattern of metal structures 260 in the dielectric inorganic substrate 250 can be optimized in terms of thermal conductivity or heat capacity. The more densely the metal structures 260 are packed in the dielectric inorganic substrate 250, the better is the heat conductivity and the thermal capacity of the dielectric inorganic substrate 250. Further, enhancing the thickness TS of the dielectric inorganic structure 250 increases the thermal capacity thereof because more metal is held available in the dielectric inorganic structure 250 for transient heat absorption.

Returning to FIG. 2B, the metal structures 260 may, e.g., have a polygonal (square, hexagonal, etc.) or a rounded cross-section. A square cross-sectional shape is exemplarily shown in FIG. 2B. A hexagonal cross-sectional shape may be beneficial as it provides for a particular high area packing density of metal in the dielectric inorganic structure 250.

Each metal structure 260 may have an axial-symmetric cross-sectional shape. Further, each metal structure 260 may have a substantially constant cross-sectional shape along its extension through the dielectric inorganic substrate 250.

Moreover, the pattern does not need to be designed as a regular array. Rather, the pattern may be composed of a plurality of different patterns or (e.g. regular) arrays. Such different patterns (i.e. sub-patterns) or arrays may distinguish from each other e.g. in terms of pitch P, distance D and/or cross-sectional shape of the metal structures 260.

FIGS. 3A-3L illustrate exemplary stages of manufacturing a semiconductor device in accordance with the disclosure, e.g. the semiconductor device 200 as shown in FIGS. 2A, 2B.

Figure 3A:
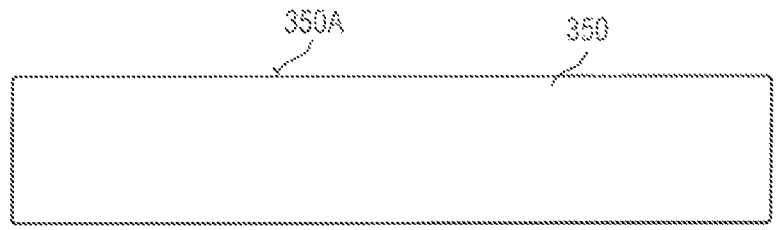
FIGS. 3A-3L are schematic cross-sectional views illustrating exemplary stages of manufacturing an exemplary semiconductor device in accordance with the disclosure.

Referring to FIG. 3A, a dielectric inorganic substrate wafer 350 is provided. The dielectric inorganic substrate wafer 350 may, e.g., have a thickness of 400 to 700 µm. The dielectric inorganic substrate wafer 350 may, e.g., be a glass wafer or a semiconductor wafer. FIGS. 3A-3L illustrate only a portion of the dielectric inorganic substrate wafer 350 which comprises, e.g., one semiconductor chip 210, see FIG. 3L.

Figure 3B:
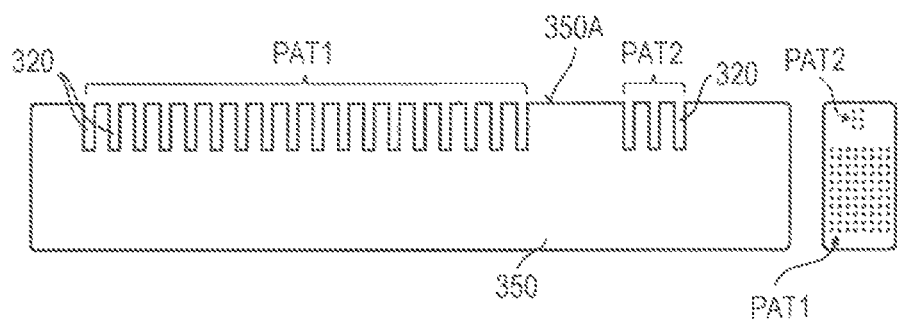

FIG. 3B illustrates the formation of recesses 320 in a top surface 350A of the dielectric inorganic substrate wafer 350. The recesses 320 may be formed by etching. The dimensions (lateral dimensions, depths) of the recesses 320 may correspond to the dimensions described above for the metal structures 260. That is, by way of example, the recesses 320 may have a lateral dimension of e.g. 20 µm and a depth of e.g. 50 µm.

According to FIG. 3B, the dielectric inorganic substrate wafer 350 may include (per chip) a first pattern PAT1 of recesses 320 and a second pattern PAT2 of the recesses 320. As shown on the right hand side of FIG. 3B which illustrates a top view on a chip portion of the dielectric inorganic substrate wafer 350, the area of PAT1 may, e.g., be substantially greater than the area of PAT2. Further, as mentioned before, the parameters (P, D, shape, . . . ) of the recesses 320 in PAT1 and in PAT2 may be different from each other or may be the same. For instance, PAT1 may correspond to a load electrode (e.g. source or drain electrode of a transistor) of the semiconductor chip 210 while PAT2 may correspond to a control electrode (e.g. gate electrode of the transistor) of the semiconductor chip 210.

In one embodiment, only the first pattern PAT1 is formed as a pattern of recesses, while the second pattern PAT2 is replaced by another type of through connection such as, e.g., a single hole serving as a through connection for, e.g., the control electrode of the semiconductor chip 210.

Some of the recesses 320 formed in the dielectric inorganic substrate wafer 350 may have a depth which is smaller than the target thickness of the dielectric inorganic substrate wafer 350 (i.e. TS of FIG. 2A), while other recesses 320 have a depth greater than the target thickness of the dielectric inorganic substrate wafer 350.

Figure 3C:
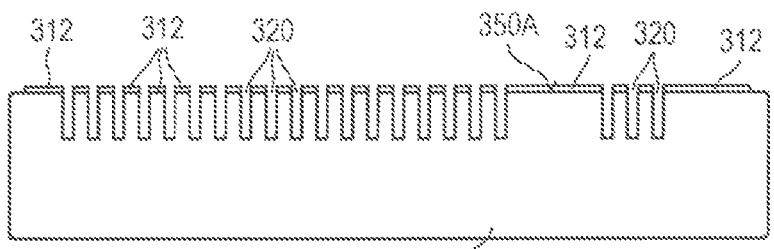

Referring to FIG. 3C, a liner 312 may optionally be deposited over the top surface 350A of the dielectric inorganic substrate wafer 350. The liner 312 may, e.g., be an electrically conductive seed layer.

Figure 3D:
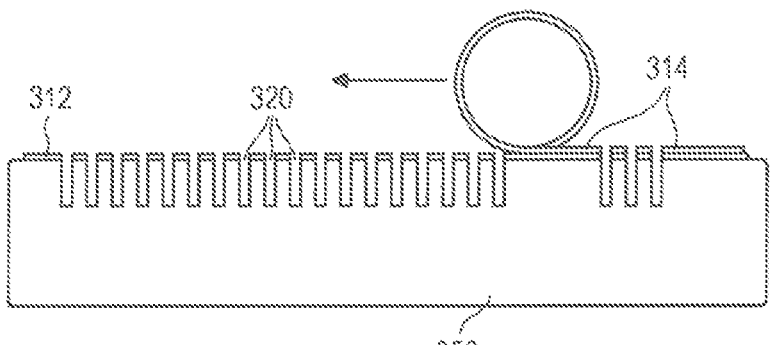

Referring to FIG. 3D, a protective layer 314 may be applied over the top surface of the dielectric inorganic substrate wafer 350 and, e.g., over the liner 312. The protective layer 314 may be applied using a self-aligned process. That is, the protective layer 314 may only be applied over parts of the top surface 350A of the dielectric inorganic substrate wafer 350 which are not recessed. The protective layer 314 may, e.g., be applied by a rolling and/or printing process and may, e.g., completely cover the liner 312 at non-recessed parts of the top surface 350A of the dielectric inorganic substrate wafer 350.

Figure 3E:
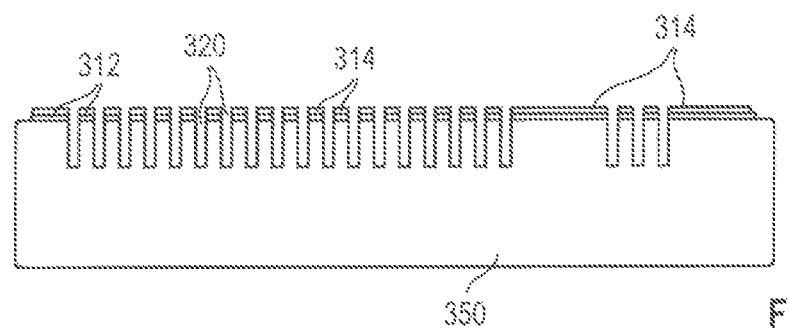

It is to be noted that the processes of liner 312 deposition and/or protective layer 314 deposition as shown in FIGS. 3C and 3D are optional processes, since metal plating, as described in the following, can also be carried out without liner 312 and/or protective layer 314 deposition. FIG. 3E shows the structure after application of the protective layer 314.

Figure 3F:
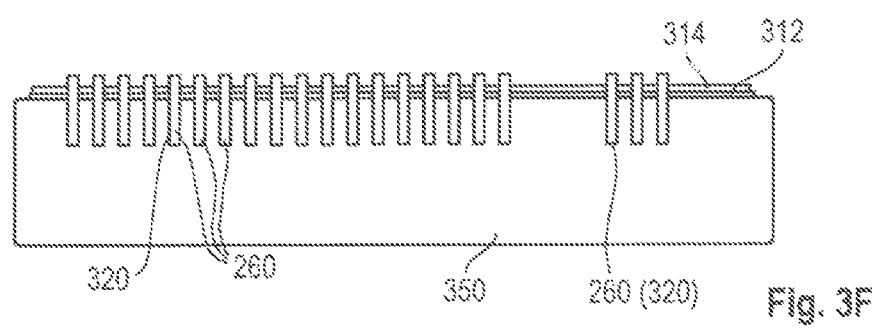

Referring to FIG. 3F, metal is plated to fill the recesses 320. As a result, the metal structures 260 are formed. The metal structures 320 may completely fill the recesses 320.

The metal structures 260 may protrude a small distance over the top surface 350A of the dielectric inorganic substrate wafer 350. Metal plating can be carried out by electro-chemical deposition (ECD). For instance, copper or a copper alloy may be used as a plating metal, but other metals known in the art to be suitable for package interconnects can also be used.

Figure 3G:
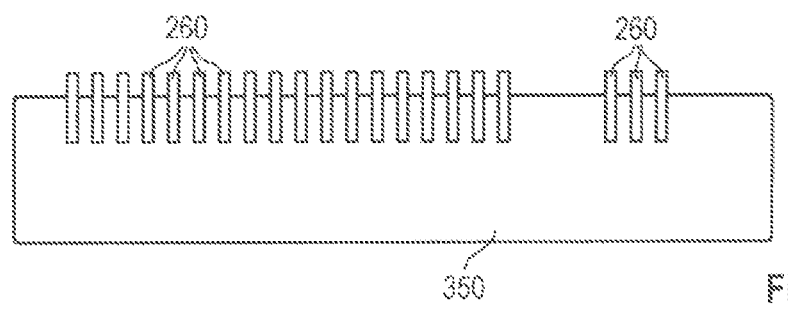

Referring to FIG. 3G, the protective layer 314 (if present) and the liner 312 (if present) are removed by, e.g., etching.

Figure 3H:
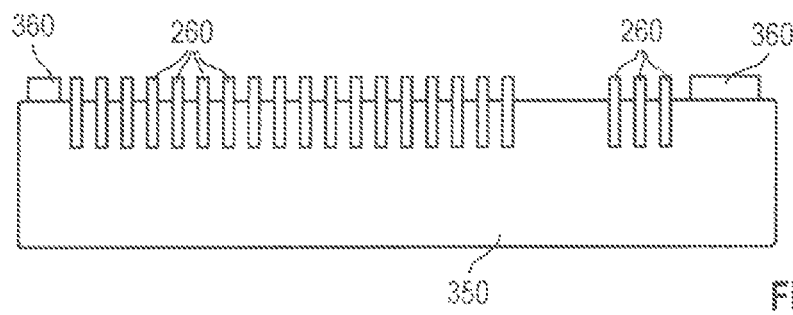

Referring to FIG. 3H, a bonding material 360 may be applied on the dielectric inorganic substrate wafer 350. The bonding material 360 may be applied on areas of the dielectric inorganic substrate wafer 350 which correspond to inactive areas of a semiconductor wafer 310 (see FIG. 3I). For instance, the bonding material 360 may be applied in a kerf pattern, i.e. along designated cutting lines of the dielectric inorganic substrate wafer 350 and the semiconductor wafer 310.

Figure 3I:
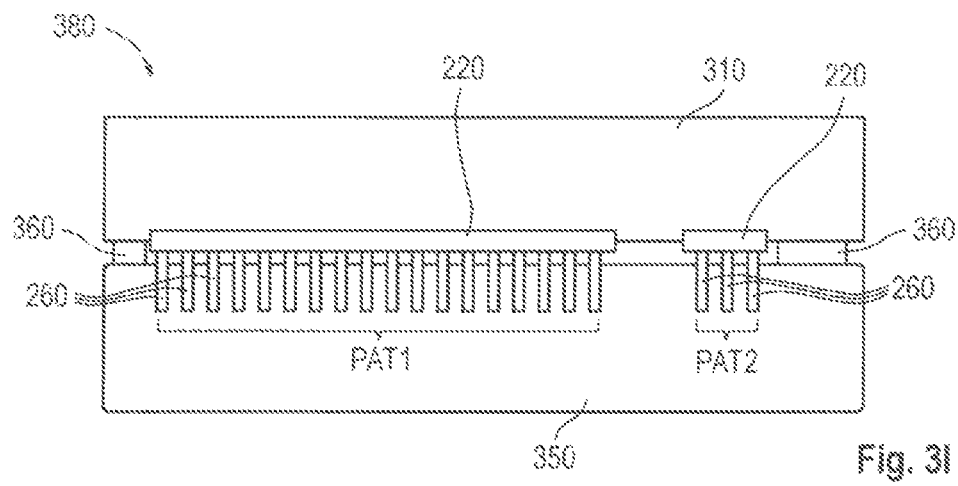

The bonding material 360 may comprise or be glass glue or a resin or any other material suitable to permanently bond the dielectric inorganic substrate wafer 350 to the semiconductor wafer 310 (see FIG. 3I).

Referring to FIG. 3I, the front side of a semiconductor wafer 310 is combined with the dielectric inorganic substrate wafer 350 to form a composite wafer 380. During this process the plurality of patterns of metal structures 260 is placed opposite the plurality of electrodes 220 on the semiconductor wafer 310. Again, it is to be noted that FIG. 3I only shows a partial view of the dielectric inorganic substrate wafer 350 and the semiconductor wafer 310 which substantially corresponds to one semiconductor chip 210 in the semiconductor wafer 310. Hence, the first pattern PAT1 of metal structures 260 and the second pattern PAT2 of metal structures 260 may form sub-patterns corresponding to two electrodes 220 of a single semiconductor chip 210 of the semiconductor wafer 310.

The process of combining the semiconductor wafer 310 and the dielectric inorganic substrate wafer 350 as shown in FIG. 3I may be carried out by using optical alignment through the dielectric inorganic substrate wafer 350 (e.g. so-called through-glass alignment or through-semiconductor alignment). That is, an optical alignment processes may be carried out by viewing through the dielectric inorganic substrate wafer 350 to recognize the position of the semiconductor wafer 310 relative to the position of the dielectric inorganic substrate wafer 350 so as to combine the semiconductor wafer 310 and the dielectric inorganic substrate wafer 350 in proper alignment.

The bonding material 360 may have also been applied to the semiconductor wafer 310 rather than to the dielectric inorganic substrate wafer 350.

Figure 3J:
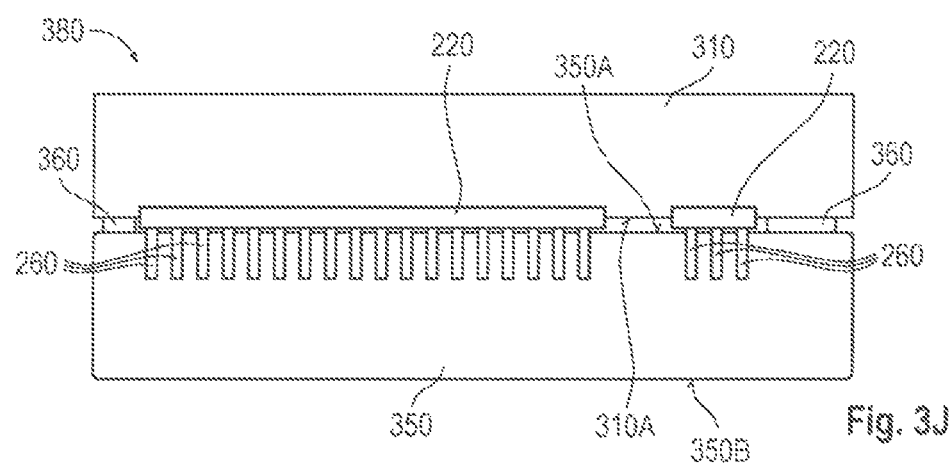

FIG. 3J illustrates the process of bonding the semiconductor wafer 310 to the dielectric inorganic substrate wafer 350 with the front side 210A of the semiconductor wafer 310 facing the dielectric inorganic substrate wafer 350. This process may concurrently connect the plurality of patterns of metal structures 260 on the dielectric inorganic substrate wafer 350 to the plurality of electrodes 220 on the semiconductor wafer 310. The process may be carried out by applying heat and pressure to the composite wafer 380.

By virtue of this process the bonding 360 material fixedly secures the semiconductor wafer 310 to the dielectric inorganic substrate wafer 350. Further, by this or another process, the metal structures 260 may be electrically and mechanically fixedly connected to the electrodes 220. The connections may be solder-free, i.e. no solder material may be used for establishing the electrical, mechanical and thermal connection between the electrodes 220 and the metal structures 260. By way of example, the connection may be created by the formation of an eutectic phase between the metal of the electrodes 220 and the metal of the metal structures 260.

Figure 3K:
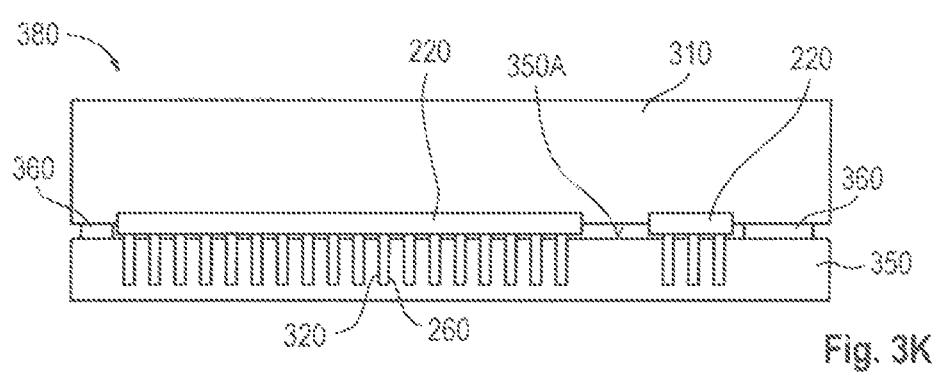
Figure 3L:
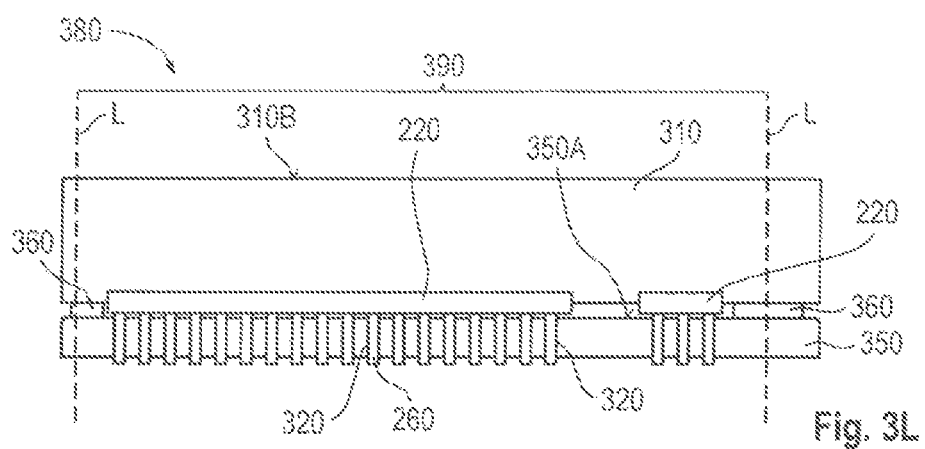

Referring to FIGS. 3K and 3L, the dielectric inorganic substrate wafer 350 is thinned from a bottom surface 350B (see FIG. 3J) opposite the top surface 350A to expose the metal of at least a part or of all of the metal structures 260 in the recesses 320.

More specifically, thinning may, e.g., be carried out in a multi-stage process. For instance, as shown in FIG. 3K, thinning may comprise grinding the dielectric inorganic substrate wafer 350 down to a thickness which is only slightly larger than the depth of the recesses 320. For instance, grinding may stop at a distance of equal to or less than 20 µm or 15 µm or 10 µm over the bottom of the recesses 320.

The metal structures 260 or at least a part of them may then be exposed by etching the dielectric inorganic substrate wafer 350 down to the thickness TS (see FIG. 2A). Etching may be carried out by wet or dry chemical etching. Etching may be continued until the metal structures 260 (or at least some of them) protrude a small distance such as, e.g., a few µm over the bottom surface of the thinned dielectric inorganic substrate wafer 350. The bottom surface of the thinned dielectric inorganic substrate wafer 350 may correspond to the bottom surface 250B of the dielectric inorganic substrate 250 as shown in FIG. 2A.

In the following, a number of standard back-end-of-line (BEOL) processes of chip packaging may be carried out on the composite wafer 380 shown in FIG. 3L. In this context, the composite wafer 380 is separated along dicing lines L into composite chips 390. Separating the composite wafer 380 into composite chips 390 may be carried out by any suitable dicing methods, e.g. mechanical sawing, laser dicing and/or etching.

Figure 4:
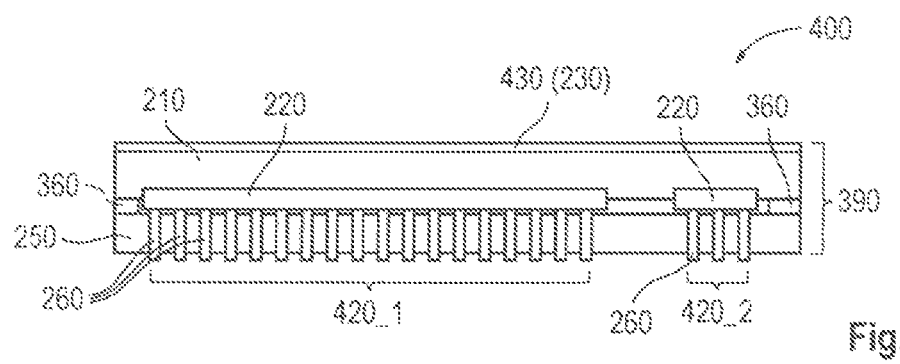
FIG. 4 is a schematic cross-sectional view of a further exemplary semiconductor device in accordance with the disclosure.

FIG. 4 illustrates a semiconductor device 400 including a composite chip such as, e.g., composite chip 390 shown in FIG. 3L. The semiconductor device 400 is similar to semiconductor device 200, and reference is made to the above description to avoid reiteration. As shown in FIG. 4, the semiconductor device 400 may further include an optional backside metallization layer 430. The backside metallization layer 430 may correspond to the backside electrode 230 of FIG. 2A. It is to be noted that the backside metallization layer 430 may have been formed on wafer level (i.e. before separating the composite wafer 380 into composite chips 390) or may be formed after chip separation.

That is, the backside metallization layer 430 may be applied as a structured layer on the backside 310B of the semiconductor wafer 310. The structure may be a chip-wise structure, i.e. inactive regions or kerf regions of the semiconductor wafer 310 may remain uncovered by the backside metallization layer 430. This allows to avoid dicing through the backside metallization layer 430 during composite chip 390 separation and may further allow to shape the backside electrode 230 in a desired manner. For instance, a circumferential frame-like uncovered area (not shown) between an outline of the backside electrode 230 and the edge of the composite chip 390 may be formed.

In this example the semiconductor device 400 includes three package terminals, namely the backside electrode 230 (e.g. structured from the backside metallization layer 430), a first front side electrode 420_1 and a second front side electrode 420_2. The first and second front side electrodes 420_1, 420_2 or at least one of these front side electrodes 420_1, 420_2 (e.g. a load electrode 420_1) may be implemented as a pattern of metal structures 260 in accordance with the above description.

The front side electrodes 420_1 and/or 420_2 may be configured to be directly soldered to an application board (not shown). In other words, the composite chip 390 as diced out of the composite wafer 380 may optionally already represent the fully packaged semiconductor device 400. In this case the process and the semiconductor device 400 described herein could be referred to as "composite wafer level packaging" by analogy with the conventional technique of "embedded wafer level packaging".

The semiconductor chip 390 may further be embedded in an encapsulant (not shown). The encapsulant may be applied before or after the composite wafer 380 is separated into composite chips 390, i.e. on (composite) wafer level in accordance with a conventional embedded wafer level packaging technique or on (composite) chip level by using a conventional chip package molding technique.

A further beneficial aspect of the process described herein may be that the standard glass carrier wafer used for handling and processing the semiconductor wafer 310 can be omitted since the dielectric inorganic substrate wafer 350 can be used to take-on its role. More specifically, in standard wafer handling and/or processing a glass carrier wafer is sometimes used as tool to stabilize the semiconductor wafer during handling and processing, e.g. during grinding. This standard glass carrier wafer is a temporary wafer which is usually demounted before wafer dicing. The dielectric inorganic substrate wafer 350 may replace such standard glass carrier wafer, i.e. the process described herein can be carried out without using such a standard glass carrier wafer. The dielectric inorganic substrate wafer 350 distinguishes from such standard glass carrier wafer by, inter alia, comprising the plurality of patterns of metal structures 260 and by being permanently bonded to the semiconductor wafer 310.

Further, FIG. 4 illustrates that the semiconductor device 400 is provided with an edge termination (diced bonding material 360). The edge termination could cover the semiconductor chip 210 until its last active cell. The edge termination may provide a fully circumferential and, e.g., hermetically tight protection against environmental attack such as, e.g., humidity or other substances which could chemically impact the composite chip 390. If the semiconductor device 400 is embedded in an encapsulant (not shown), the encapsulant my cover the edge termination (diced bonding material 360) or leave the edge termination exposed.

The following examples pertain to further aspects of the disclosure:

Example 1 is a method of manufacturing a semiconductor device, the method comprising: forming a plurality of patterns of metal structures in a dielectric inorganic substrate wafer, wherein the metal structures are accommodated in recesses of the dielectric inorganic substrate wafer and at least partly connect through the dielectric inorganic substrate wafer; providing a semiconductor wafer comprising a front side and a backside, wherein a plurality of electrodes is disposed on the front side of the semiconductor wafer;

bonding the front side of the semiconductor wafer to the dielectric inorganic substrate wafer to form a composite wafer, wherein the plurality of patterns of metal structures is connected to the plurality of electrodes; and separating the composite wafer into composite chips.

In Example 2, the subject matter of Example 1 can optionally include wherein forming a plurality of patterns of metal structures in the dielectric inorganic substrate wafer comprises: forming recesses in a first surface of the dielectric inorganic substrate wafer; metal plating to fill the recesses with metal; thinning the dielectric inorganic substrate wafer from a second surface opposite the first surface to expose the metal of at least a part of the recesses.

In Example 3, the subject matter of Example 2 can optionally include wherein thinning comprises: grinding the dielectric inorganic substrate wafer down to a thickness which is slightly larger than the depth of the recesses; and etching the dielectric inorganic substrate wafer to expose the metal.

In Example 4, the subject matter of any preceding Example can optionally include wherein bonding the front side of the semiconductor wafer to the dielectric inorganic substrate wafer comprises: applying a kerf pattern of bonding material between the semiconductor wafer and the dielectric inorganic substrate wafer; and applying heat and pressure to bond the semiconductor wafer to the dielectric inorganic substrate wafer, thereby connecting the plurality of electrodes to the plurality of patterns of metal structures.

In Example 5, the subject matter of any preceding Example can optionally include wherein a percentage in volume of metal in the dielectric inorganic substrate wafer within a pattern of metal structures is equal to or greater than 60% or 70% or 80%.

Example 10 is a semiconductor device which can include a semiconductor chip comprising a front side and a backside, wherein an electrode is disposed on the front side of the semiconductor chip; a dielectric inorganic substrate comprising a pattern of metal structures which are accommodated in recesses of the dielectric inorganic substrate and at least partly connect through the dielectric inorganic substrate; wherein the front side of the semiconductor chip is attached to the dielectric inorganic substrate and the electrode is connected to the pattern of metal structures.

In Example 7, the subject matter of Example 6 can optionally include wherein the dielectric inorganic substrate is a glass substrate or a semiconductor substrate.

In Example 8, the subject matter Example 6 or 7 can optionally include wherein adjacent metal structures are spaced apart from each other by a distance equal to or less than 10 μm or 5 μm or 4 μm or 3 μm.

In Example 9, the subject matter of any of Examples 6 to 8 can optionally include wherein a length of those metal structures which connect through the dielectric inorganic substrate is equal to or greater than 25 μm or 50 μm or 100 μm or 200 μm.

In Example 10, the subject matter of any of Examples 6 to 9 can optionally include wherein the metal structures are plated metal pillars.

In Example 11, the subject matter of any of Examples 6 to 10 can optionally include wherein the pattern is a regular array.

In Example 12, the subject matter of any of Examples 6 to 11 can optionally include wherein the semiconductor chip and the dielectric inorganic substrate have aligned cutting edges.

In Example 13, the subject matter of any of Examples 6 to 12 can optionally include wherein a percentage in volume of metal in the dielectric inorganic substrate within the pattern of metal structures is equal to or greater than 60% or 70% or 80%.

In Example 14, the subject matter of any of Examples 6 to 13 can optionally include wherein the semiconductor chip and the dielectric inorganic substrate are tightly sealed together at their edge regions.

In Example 15, the subject matter of any of Examples 6 to 14 can optionally include wherein the electrode is connected to the pattern of metal structures by solder-free connections.

In Example 16, the subject matter of any of Examples 6 to 15 can optionally include wherein the dielectric inorganic substrate is configured to be soldered to an application board, with the pattern of metal structures forming an electrical and thermal connection between the electrode of the semiconductor chip and a solder joint on the application board.

In Example 17, the subject matter of any of Examples 6 to 16 can optionally include wherein the semiconductor chip is a power semiconductor chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a plurality of patterns of metal structures in a dielectric inorganic substrate wafer, wherein the metal structures are accommodated in recesses of the dielectric inorganic substrate wafer and at least partly connect through the dielectric inorganic substrate wafer, and wherein the metal structures protrude from a first surface and a second surface of the dielectric inorganic substrate wafer;
    providing a semiconductor wafer comprising a front side and a backside, wherein a plurality of electrodes is disposed on the front side of the semiconductor wafer;
    bonding the front side of the semiconductor wafer to the dielectric inorganic substrate wafer to form a composite wafer, wherein the plurality of patterns of metal structures is directly connected to the plurality of electrodes; and
    separating the composite wafer into composite chips, at least one of the composite chips comprising one or more package terminals each implemented as a pattern of at least two distinct and separated metal structures protruding from an outer surface of the composite chip,
    wherein at least one of the plurality of patterns of metal structures includes adjacent metal structures that are spaced apart from each other by a distance equal to or less than 10 μm or 5 μm or 4 μm or 3 μm and/or a pitch that is equal to or less than 15 μm or 17.5 μm or 20 μm or 27.5 μm or 30 μm.

2. The method of claim 1, wherein forming a plurality of patterns of metal structures in the dielectric inorganic substrate wafer comprises:
    forming recesses in the first surface of the dielectric inorganic substrate wafer;
    metal plating to fill the recesses with metal; and thinning the dielectric inorganic substrate wafer from the second surface opposite the first surface to expose the metal of at least a part of the recesses,
wherein sidewalls of the metal filling the recesses protrude from the first surface and the second surface of the dielectric inorganic substrate wafer.

3. The method of claim 2, wherein the thinning comprises:
grinding the dielectric inorganic substrate wafer down to a thickness which is larger than the depth of the recesses; and
etching the dielectric inorganic substrate wafer to expose the metal.

4. The method of claim 1, wherein bonding the front side of the semiconductor wafer to the dielectric inorganic substrate wafer comprises:
applying a kerf pattern of bonding material between the semiconductor wafer and the dielectric inorganic substrate wafer; and
applying heat and pressure to bond the semiconductor wafer to the dielectric inorganic substrate wafer, thereby connecting the plurality of electrodes to the plurality of patterns of metal structures.

5. The semiconductor device of claim 4, wherein the plurality of electrodes is connected to the plurality of patterns of metal structures by solder-free connections.

6. The method of claim 1, wherein a percentage in volume of metal in the dielectric inorganic substrate wafer within a pattern of metal structures is equal to or greater than 60% or 70% or 80%.

7. The method of claim 1, wherein the metal structures in at least one of the plurality of patterns of metal structures have a rounded or a polygonal cross-sectional shape.

8. The method of claim 7, wherein the cross-sectional shape of the metal structures is hexagonal.

9. The method of claim 1, wherein at least one of the plurality of patterns of metal structures includes a plurality of different patterns of metal structures.

10. The method of claim 1, wherein at least one of the plurality of patterns of metal structures is a regular array.

11. The method of claim 1, wherein forming the plurality of patterns of metal structures in the dielectric inorganic substrate wafer comprises:
forming at least one densely packed array of the metal structures in the dielectric inorganic substrate wafer, wherein adjacent metal structures in the densely packed array are spaced apart from each other by a distance equal to or less than 10 μm or 5 μm or 4 μm or 3 μm.

12. The method of claim 11, wherein the at least one densely packed array of the metal structures includes a pitch that is equal to or less than 15 μm or 17.5 μm or 20 μm or 27.5 μm or 30 μm.

13. The method of claim 11, wherein the at least one densely packed array of the metal structures includes a pattern of metal structures having a plurality of different patterns.

14. The method of claim 11, wherein the at least one densely packed array of the metal structures includes a pattern of metal structures having a regular array.

15. The method of claim 11, wherein the cross-sectional shape of the metal structures in the at least one densely packed array is hexagonal.

16. A method of manufacturing a semiconductor device, the method comprising:
forming a plurality of patterns of metal structures in a dielectric inorganic substrate wafer, wherein the metal structures are accommodated in recesses of the dielectric inorganic substrate wafer and at least partly connect through the dielectric inorganic substrate wafer, and wherein the metal structures protrude from a first surface and a second surface of the dielectric inorganic substrate wafer;
providing a semiconductor wafer comprising a front side and a backside, wherein a plurality of electrodes is disposed on the front side of the semiconductor wafer;
bonding the front side of the semiconductor wafer to the dielectric inorganic substrate wafer to form a composite wafer, wherein the plurality of patterns of metal structures is directly connected to the plurality of electrodes; and
separating the composite wafer into composite chips, wherein distinct and separated portions of individual metal structures that protrude from the dielectric inorganic substrate wafer form one or more package terminals of the composite chips,
wherein at least one of the plurality of patterns of metal structures includes adjacent metal structures that are spaced apart from each other by a distance equal to or less than 10 μm or 5 μm or 4 μm or 3 μm and/or a pitch that is equal to or less than 15 μm or 17.5 μm or 20 μm or 27.5 μm or 30 μm.

17. A method of manufacturing a semiconductor device, the method comprising:
forming a plurality of patterns of metal structures in a dielectric inorganic substrate wafer, wherein the metal structures are accommodated in recesses of the dielectric inorganic substrate wafer and at least partly connect through the dielectric inorganic substrate wafer, and wherein the metal structures protrude from a first surface and a second surface of the dielectric inorganic substrate wafer;
providing a semiconductor wafer comprising a front side and a backside, wherein a plurality of electrodes is disposed on the front side of the semiconductor wafer;
bonding the front side of the semiconductor wafer to the dielectric inorganic substrate wafer to form a composite wafer, wherein the plurality of patterns of metal structures is directly connected to the plurality of electrodes; and
separating the composite wafer into composite chips,
wherein at least one of the plurality of patterns of metal structures includes adjacent metal structures that are spaced apart from each other by a distance equal to or less than 10 μm or 5 μm or 4 μm or 3 μm and/or a pitch that is equal to or less than 15 μm or 17.5 μm or 20 μm or 27.5 μm or 30 μm, and
wherein a percentage in volume of metal in the dielectric inorganic substrate wafer within a pattern of metal structures is equal to or greater than 60% or 70% or 80%.

* * * * *